United States Patent
Lian et al.

(10) Patent No.: US 11,042,100 B2
(45) Date of Patent: Jun. 22, 2021

(54) MEASUREMENT APPARATUS AND METHOD OF MEASURING A TARGET

(71) Applicant: ASML Netherlands B.V., Veldhoven (NL)

(72) Inventors: Jin Lian, Eindhoven (NL); Zili Zhou, Veldhoven (NL); Duygu Akbulut, Eindhoven (NL); Sergey Tarabrin, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/410,250

(22) Filed: May 13, 2019

(65) Prior Publication Data

US 2019/0369505 A1  Dec. 5, 2019

(30) Foreign Application Priority Data

May 31, 2018 (EP) .................................... 18175297

(51) Int. Cl.
*G03F 7/20* (2006.01)
(52) U.S. Cl.
CPC ................ *G03F 7/70641* (2013.01)
(58) Field of Classification Search
CPC ............ G03F 7/70633; G03F 7/70625; G03F 7/70616; G03F 7/70641; G03F 7/7065; G03F 7/7085; G03F 9/7088; G03F 7/0191; G03F 9/7076; G03F 7/7015; G03F 9/7003; G03F 1/42; G03F 1/84; G03F 7/70091; G03F 7/706; G03F 9/7026; G03F 7/70508; G03F 7/705; G03F 7/70225;

(Continued)

(56) References Cited

U.S. PATENT DOCUMENTS 6,961,116 B2 * 11/2005 Den Boef .............. G03B 27/32
                                                              355/53
8,456,641 B1    6/2013 Levinski et al.
(Continued)

FOREIGN PATENT DOCUMENTS

WO  WO 2009/078708 A1  6/2009
WO  WO 2009/106279 A1  9/2009
WO  WO 2016/123508 A1  8/2016

OTHER PUBLICATIONS

International Search Report and Written Opinion of the International Searching Authority directed to related International Patent Application No. PCT/EP2019/061201, dated Jul. 22, 2019; 13 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

The disclosure relates to measuring a target. In one arrangement, a measurement apparatus is provided that has an optical system configured to illuminate a target with radiation and direct reflected radiation from the target to a sensor. A programmable spatial light modulator in a pupil plane of the optical system is programmed to redirect light in each of a plurality of pupil plane zones in such a way as to form a corresponding plurality of images at different locations on the sensor. Each image is formed by radiation passing through a different respective one of the pupil plane zones.

13 Claims, 5 Drawing Sheets

(58) Field of Classification Search
CPC ............. G03F 7/70133; G03F 7/70116; G03F 7/70191; G03F 7/70516; G03F 7/70108; G03F 7/70525; G03F 7/70258; G03F 7/70483; G03F 7/70291; G01N 21/47; G01N 21/8806; G01B 11/14; H01L 22/12
See application file for complete search history.

(56) References Cited

U.S. PATENT DOCUMENTS

| | | |
|---|---|---|
| 8,786,825 B2 | 7/2014 | Van De Kerkhof et al. |
| 2011/0027704 A1 | 2/2011 | Cramer et al. |
| 2011/0043791 A1 | 2/2011 | Smilde et al. |
| 2012/0123581 A1* | 5/2012 | Smilde ............... G03F 7/70483 700/105 |
| 2012/0242970 A1 | 9/2012 | Smilde et al. |
| 2018/0031424 A1 | 2/2018 | Hill et al. |

OTHER PUBLICATIONS

R. W. Gerchberg and W. O. Saxton, "A practical algorithm for the determination of the phase from image and diffraction plane pictures," Optik 35, (1972); pp. 237-246.

Wai-Hon Lee, "Binary computer-generated holograms", Applied Optics 18, (1979); pp. 3661-3669.

Christian Maurer, et. al, "Depth of field multiplexing in microscopy", Optics Express, 18, (2010); pp. 3023-3034.

Taiwanese Office Action directed to related Taiwanese Patent Application No. 108116844, dated Mar. 22, 2021; 12 pages.

* cited by examiner

Fig.8
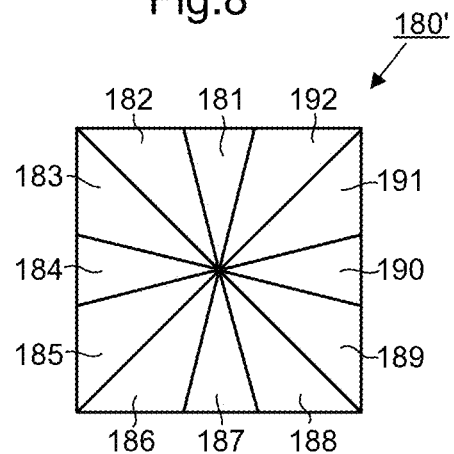
Fig.9
| 181 | 188 |
| --- | --- |
| 182 | 187 |
| 183 | 186 |
| 184 | 185 |
Fig.10
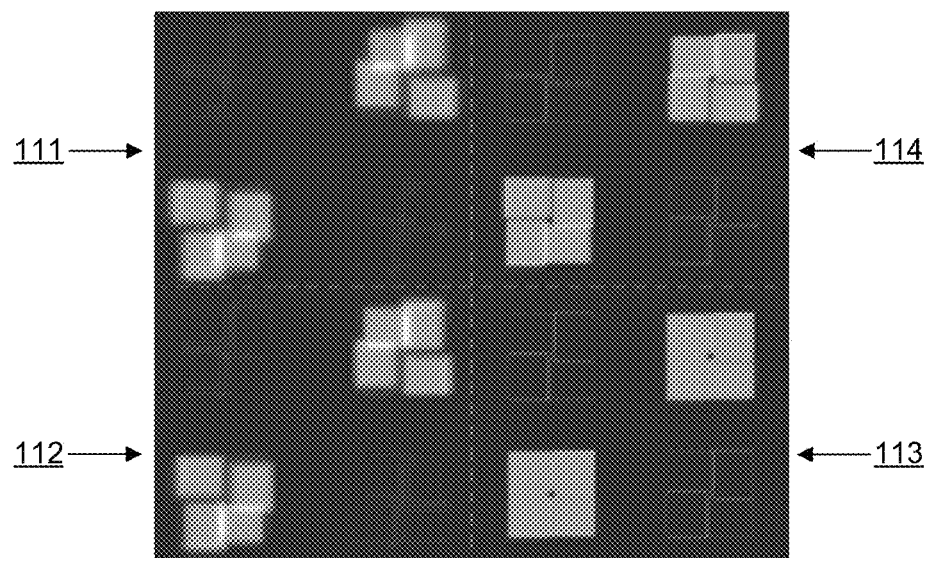

MEASUREMENT APPARATUS AND METHOD OF MEASURING A TARGET

FIELD

The present description relates to a measuring apparatus and a method of measuring a target, usable for example in the context of performing metrology measurements in a manufacturing process involving lithography.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are involved in the patterning process.

Metrology processes are used at various steps during a patterning process to monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be designed or altered, e.g., based on the measurements of the one or more characteristics, such that substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Error, such as error in overlay, error in CD, etc., will inevitably be produced in the patterning process. For example, imaging error may be produced from optical aberration, patterning device heating, patterning device error, and/or substrate heating and can be characterized in terms of, e.g., overlay, CD, etc. Additionally or alternatively, error may be introduced in other parts of the patterning process, such as in etch, development, bake, etc. and similarly can be characterized in terms of, e.g., overlay, CD, etc. The error may cause a problem in terms of the functioning of the device, including failure of the device to function or one or more electrical problems of the functioning device. Accordingly, it is desirable to be able to characterize one or more these errors and take steps to design, modify, control, etc. a patterning process to reduce or minimize one or more of these errors.

SUMMARY

According to an aspect, there is provided a measurement apparatus comprising: an optical system configured to illuminate a target with radiation and direct reflected radiation from the target to a sensor; and a programmable spatial light modulator in a pupil plane of the optical system, the spatial light modulator being programmed to redirect light in each of a plurality of pupil plane zones in such a way as to form a corresponding plurality of images at different locations on the sensor, each image being formed by radiation passing through a different respective one of the pupil plane zones.

According to an aspect, there is provided a method of measuring a target, comprising: illuminating the target with radiation and detecting reflected radiation from the target on a sensor; using a programmable spatial light modulator to redirect light in each of a plurality of pupil plane zones in a pupil plane to form a corresponding plurality of images at different locations on the sensor, each image being formed by radiation passing through a different respective one of the pupil plane zones.

BRIEF DESCRIPTION OF THE DRAWINGS

Embodiments will now be described, by way of example only, with reference to the accompanying drawings in which:

FIG. 3B is a schematic detail of a diffraction spectrum of a target for a given direction of illumination;

FIG. 3C is a schematic illustration of a second pair of illumination apertures providing further illumination modes in using a measurement apparatus for diffraction based overlay measurements;

FIG. 3D is a schematic illustration of a third pair of illumination apertures combining the first and second pairs of apertures providing further illumination modes in using a measurement apparatus for diffraction based overlay measurements;

FIG. 8 depicts an example plurality of pupil plane zones;

FIG. 9 depicts a further example plurality of pupil plane zones; and

FIG. 10 depicts simulated plural groups of images formed in different respective regions on a sensor and having different optical corrections applied to them via an SLM in a pupil plane.

DETAILED DESCRIPTION

Before describing embodiments in detail, it is instructive to present an example environment in which embodiments may be implemented.

Figure 1:
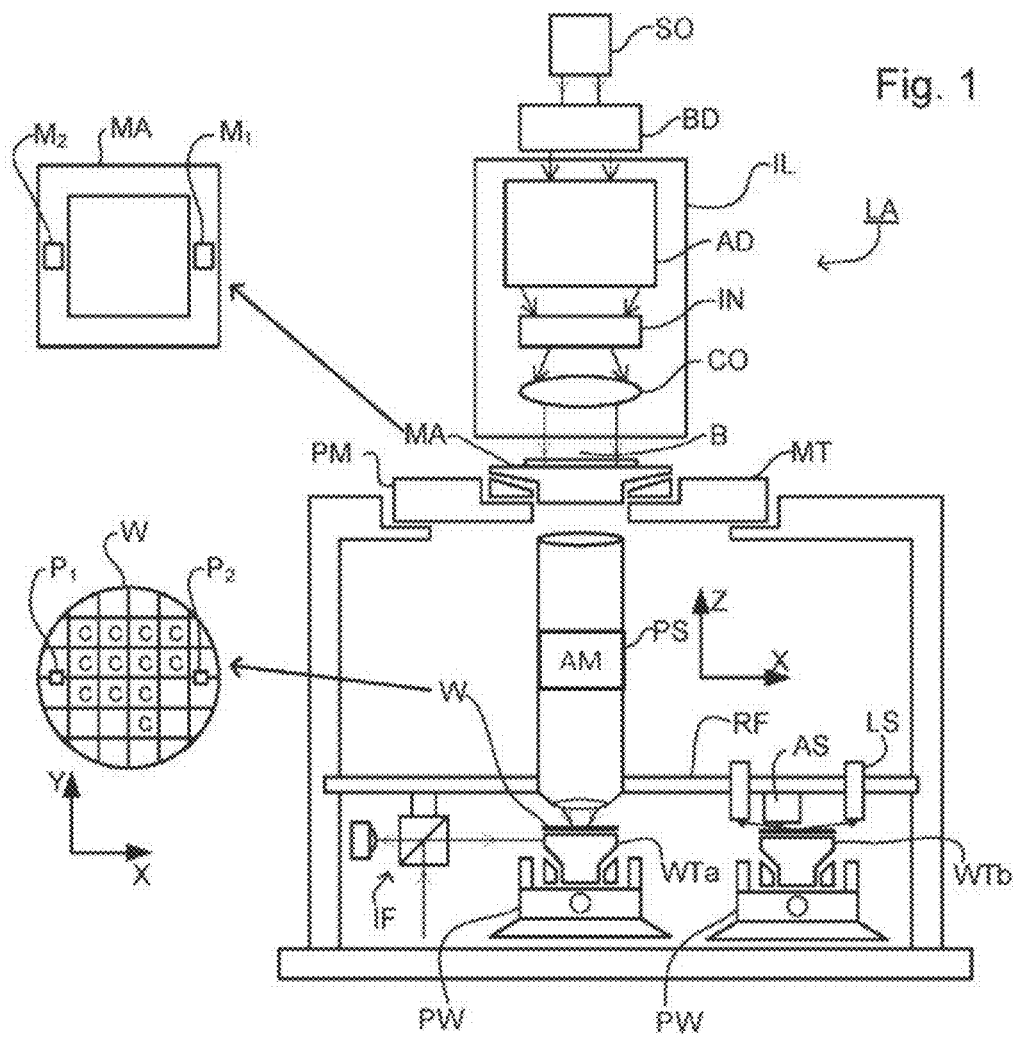
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
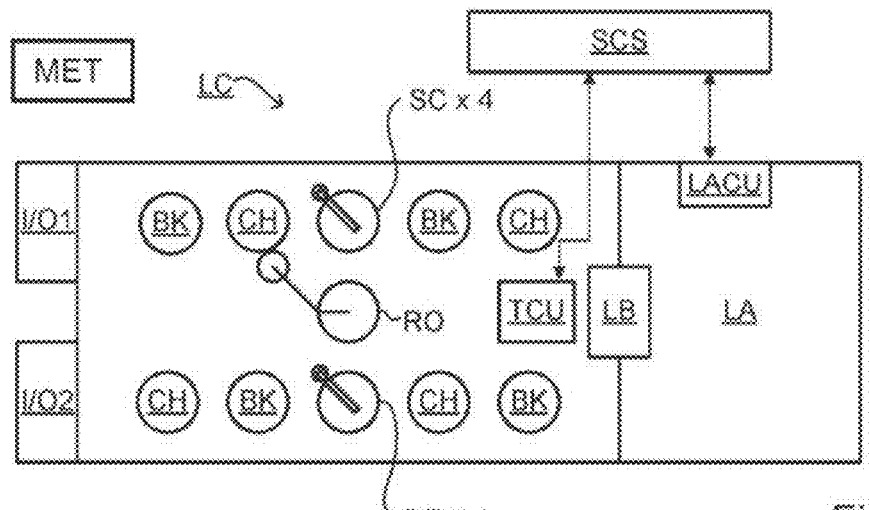
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure or determine one or more properties such as overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. The metrology apparatus may be integrated into the lithographic apparatus LA or the lithocell LC or may be a stand-alone device. To enable rapid measurement, it is desirable that the metrology apparatus measure one or more properties in the exposed resist layer immediately after the exposure. However, the latent image in the resist has a low contrast—there is only a very small difference in refractive index between the parts of the resist which have been exposed to radiation and those which have not—and not all metrology apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3A:
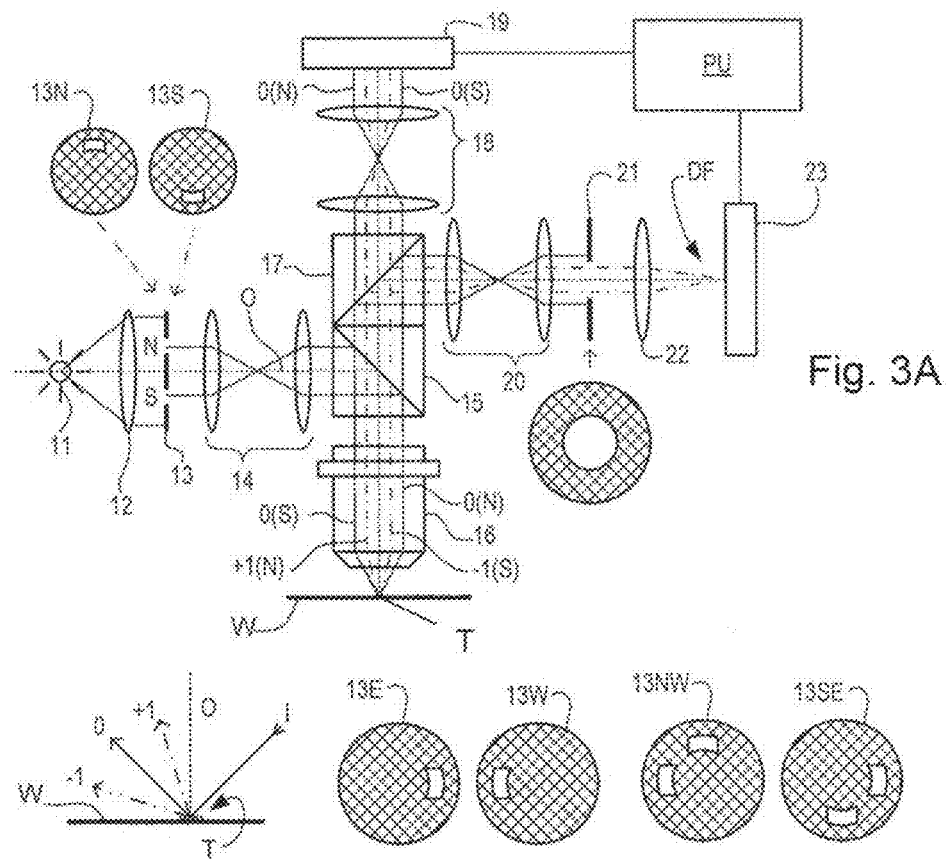
FIG. 3A is schematic diagram of a measurement apparatus for use in measuring targets according to an embodiment using a first pair of illumination apertures providing certain illumination modes.

A metrology apparatus suitable for use in embodiments to measure, e.g., overlay is schematically shown in FIG. 3A. A target T (comprising a periodic structure such as a grating) and diffracted rays are illustrated in more detail in FIG. 3B. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. For example, an alternative aperture plate may be provided in which radiation is blocked in two opposite quadrants and allowed to pass in the other two opposite quadrants, thereby providing the illumination mode 60 depicted in FIG. 6 referred to below. The rest of the pupil plane is desirably dark as any unnecessary radiation outside the desired illumination mode may interfere with the desired measurement signals.

As shown in FIG. 3B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3A and 3B are shown somewhat off axis, purely to enable them to be more easily distinguished in the diagram. At least the 0 and +1 orders diffracted by the target on substrate W are collected by objective lens 16 and directed back through prism 15.

Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1st and the +1st diffraction order intensities. Comparing these intensities for a given target provides a measurement of asymmetry in the target, and asymmetry in the target can be used as an indicator of a parameter of a lithography process, e.g., overlay. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements. The pupil plane image can also be used for other measurement purposes such as reconstruction, as described further hereafter.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane of the objective lens 16. Aperture stop 21 functions to block the zeroth order diffracted beam so that the image of the target formed on sensor 23 is formed from the −1 or +1 first order beam. Data regarding the images measured by sensors 19 and 23 are output to processor and controller PU, the function of which will depend on the particular type of measurements being performed. Note that the term 'image' is used in a broad sense. An image of the periodic structure features (e.g., grating lines) as such will not be formed, if only one of the −1 and +1 orders is present.

The particular forms of aperture plate 13 and stop 21 shown in FIG. 3 are purely examples. In another embodiment, on-axis illumination of the target is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIGS. 3C and D. FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3C, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

Figure 4:
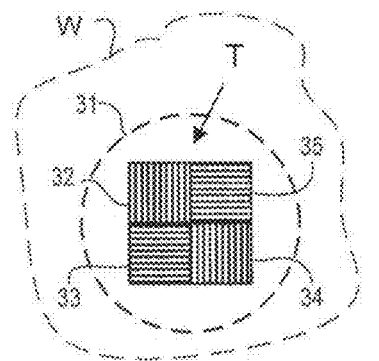
FIG. 4 schematically depicts a form of multiple periodic structure (e.g., multiple grating) target and an outline of a measurement spot on a substrate.

FIG. 4 depicts an example composite metrology target T formed on a substrate. The composite target comprises four periodic structures (in this case, gratings) 32, 33, 34, 35 positioned closely together. In an embodiment, the periodic structure layout may be made smaller than the measurement spot (i.e., the periodic structure layout is overfilled). Thus, in an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 µm×20 µm or within 16 µm×16 µm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Returning to FIG. 4, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets +d and −d respectively. While four periodic structures are illustrated, another embodiment may include a larger matrix to obtain desired accuracy. For example, a 3×3 array of nine composite periodic structures may have biases −4d, −3d, −2d, −d, 0, +d, +2d, +3d, +4d. Separate images of these periodic structures can be identified in an image captured by sensor 23.

Figure 5:
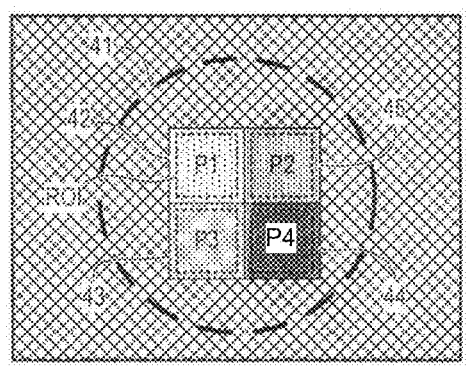
FIG. 5 schematically depicts an image of the target of FIG. 4 obtained in the apparatus of FIG. 3.

FIG. 5 shows an example of an image that may be formed on and detected by the sensor 23, using the target of FIG. 4 in the apparatus of FIG. 3, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. The target can be positioned in among device product features, rather than or in addition to in a scribe lane. If the periodic structures are located in device product areas, device features may also be visible in the periphery of this image field. Processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter.

Figure 6:
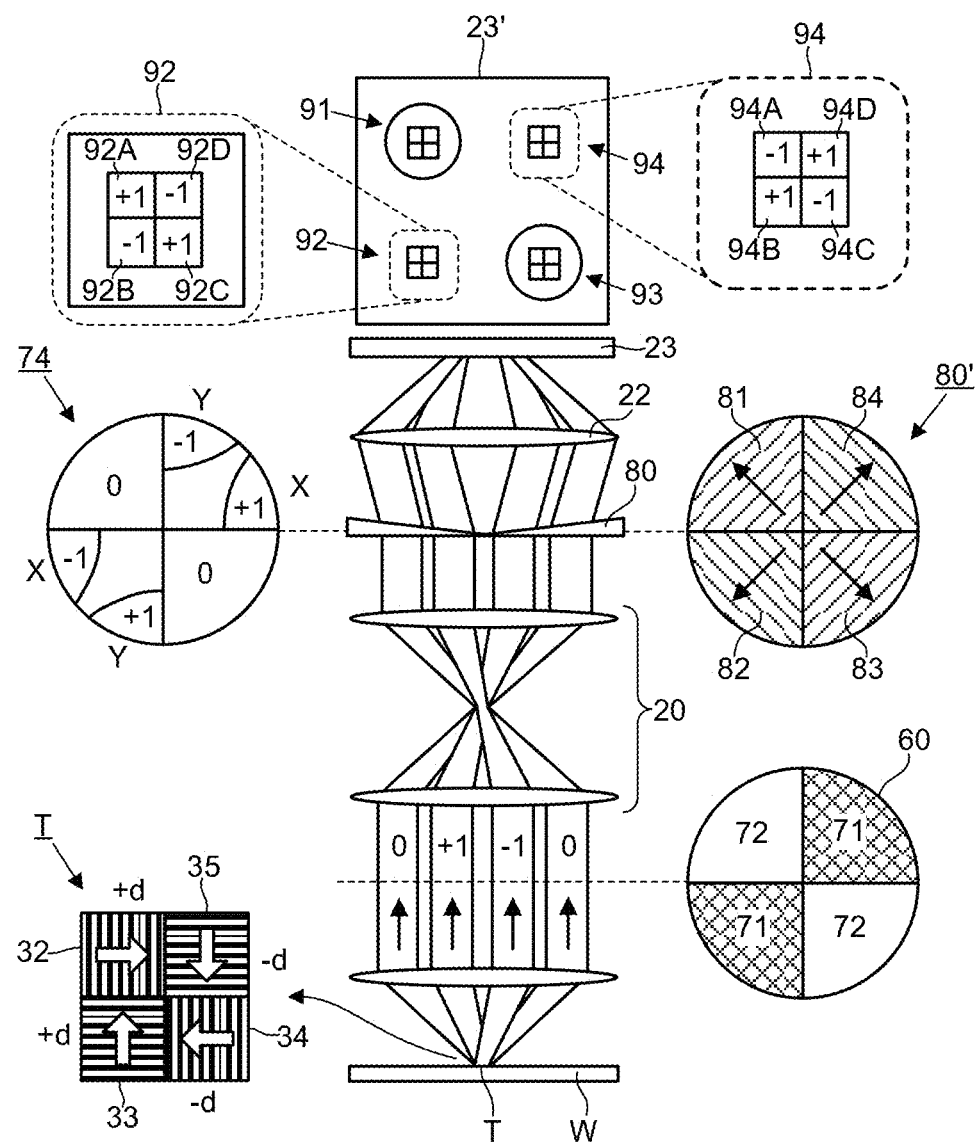
FIG. 6 schematically depicts an optical system of a measurement apparatus having a wedge-shaped optical element in a pupil plane.

FIG. 6 depicts an alternative configuration having the second measurement branch of FIG. 3A and in which an alternative aperture plate is provided instead of aperture plate 13N or 13S in the illumination path. The alternative aperture plate may be provided at the position of the aperture plate 13N or 13S shown in FIG. 3A. The illumination branch is not shown in detail in FIG. 6 to avoid repetition, but could be configured as shown in FIG. 3A or any other configuration provided optical functions compatible with the embodiments described below. The first measurement branch may or may not be present. The alternative aperture plate defines an illumination mode as depicted schematically in the lower right hand part of FIG. 6 and labelled 60. The illumination mode is such that radiation is not incident on the target T from two diametrically opposite quadrants 71 in the pupil plane and radiation is incident on the target T from the other two diametrically opposite quadrants 72 in the pupil plane. In combination with the target T comprising the four periodic structures 32-35, this illumination mode results in separation of the zeroth, +1 and −1 diffracted rays in the pupil plane as indicated by the axial view of the pupil plane radiation distribution labelled 74 in FIG. 6. The positions of the +1 and −1 orders of the periodic structures 32 and 34, which are periodic in the X direction, are labelled X in the distribution 74. The positions of the +1 and −1 orders of the periodic structures 33 and 35, which are periodic in the Y direction, are labelled Y in the distribution 74. The zeroth order radiation for all of the periodic structures 32-35 remains in the quadrants labelled "0" in distribution 74.

A group 80 of wedge-shaped optical elements 81-84 is provided in the pupil plane instead of the aperture stop 21. An axial view of the group 80 of wedge-shaped optical elements is labelled 80'. The group 80 of wedge-shaped optical elements in this example comprises four wedge-shaped optical elements 81-84. Each wedge-shaped optical element fills a quadrant of a circular region in the pupil plane when viewed along an optical axis of the optical system. Each wedge-shaped optical element 81-84 has a lower planar surface and an upper planar surface and is formed from an optical material having a refractive index different from 1. The lower planar surface is aligned obliquely with respect to the upper planar surface (in the manner of a wedge). In the example shown, a maximum gradient of each wedge-shaped optical element 81-84 is aligned along a radial direction, as indicated by the radial arrows in the axial view 80' of FIG. 6. Each wedge-shaped optical element 81-84 has a linear thickness change from the optical axis to the radially outermost edge of the wedge-shaped optical element 81-84. Each of the wedge-shaped optical elements 81-84 receives radiation in a different respective one of the quadrants of the pupil plane radiation distribution 74 and redirects the radiation so that an image of the target T is formed on the sensor 23 in a different location on the sensor 23. An axial view of the sensor 23 is labelled 23' in FIG. 6 and shows example positioning of images 91-94 formed respectively from radiation passing through wedge-shaped elements 81-84. As mentioned above, the term "image" is used here in a broad sense. The image may not comprise all details of the target T (e.g. grating lines) if some of the relevant diffraction orders are not present. In this example, images 91 and 93 correspond to images of the target T formed from zeroth order radiation only. Image 92 comprises a sub-image 92A formed from +1 diffracted rays from periodic structure 32, a sub-image 92B corresponding to −1 diffracted rays from periodic structure 33, a sub-image 92C corresponding to +1 diffracted rays from periodic structure 34, and a sub-image 92D corresponding to −1 diffracted rays from periodic structure 35. Image 94 comprises a sub-image 94A formed from −1 diffracted rays from periodic structure 32, a sub-image 94B corresponding to +1 diffracted rays from periodic structure 33, a sub-image 94C corresponding to −1 diffracted rays from periodic structure 34, and a sub-image 94D corresponding to +1 diffracted rays from periodic structure 35.

The arrangement of FIG. 6 allows simultaneous individual measurement of images of multiple periodic structures 32-35 in a target T formed from different diffraction components (e.g. −1 diffracted rays, +1 diffracted rays, and zeroth order rays). Due to the static nature of the wedge-shaped elements 81-84, the positioning of the images on the sensor 23 for a given target T and illumination mode is fixed and may not be optimal for all targets and illumination modes. If the positioning of the images is non-optimal for a given target T and/or illumination mode, the wedge-shaped elements 81-84 may need to be replaced by wedge-shaped elements having a different configuration. This is time-consuming and expensive.

Figure 7:
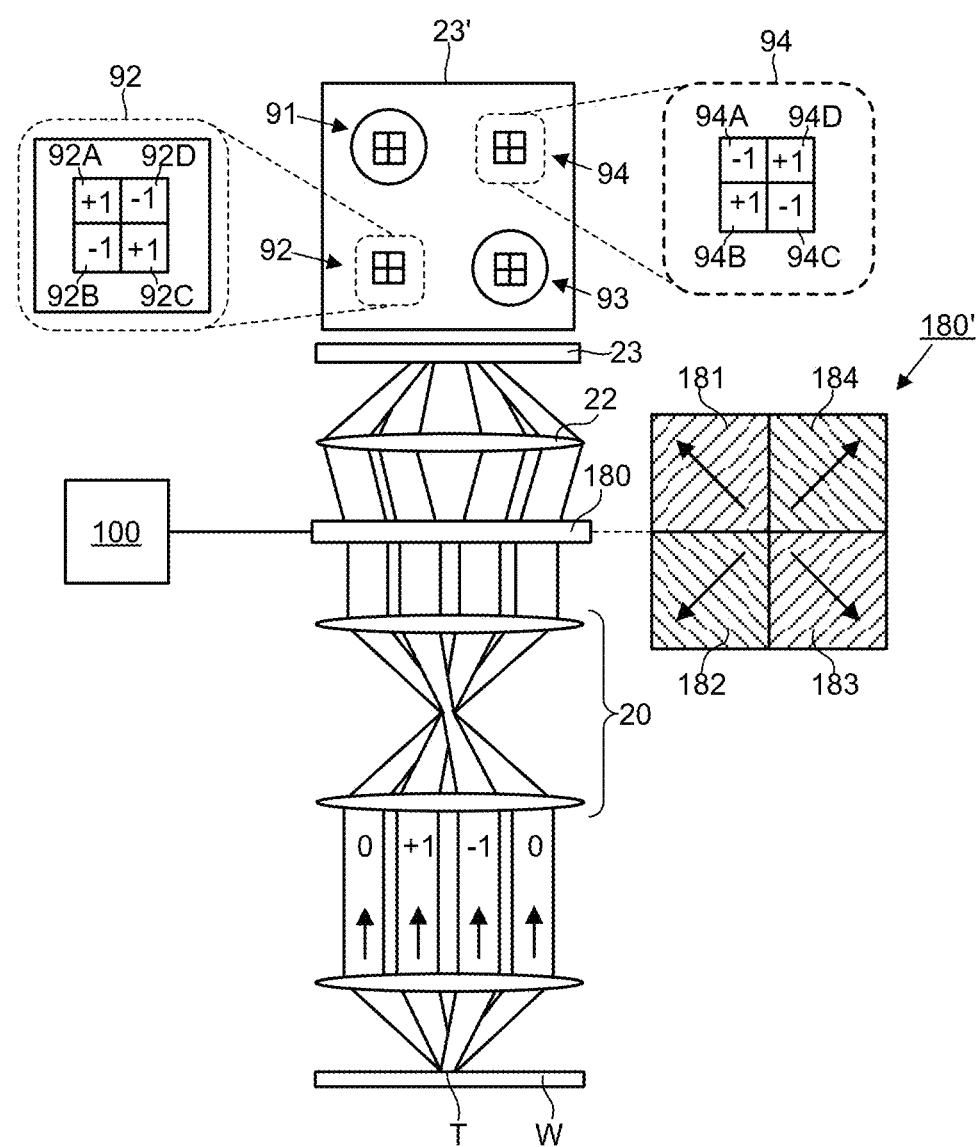
FIG. 7 schematically depicts an optical system of a measurement apparatus having an SLM in the pupil plane.

In an alternative embodiment, an example of which is described below with reference to FIG. 7, the wedge-shaped optical elements 81-84 are replaced by a programmable spatial light modulator (SLM), which provides more flexibility in how the images can be positioned on the sensor, as well as optionally allowing optical corrections to be applied. In an embodiment of this type, a measurement apparatus is provided having an optical system that illuminates a target T with radiation and directs reflected radiation from the target T to a sensor 23. The optical system may be configured as described above with reference to FIGS. 3A and 6, for example, except for the provision of an SLM 180 in place of the wedge-shaped optical elements 81-84.

The SLM 180 is provided in a pupil plane of the optical system. The SLM 180 is depicted schematically as a single unit but it will be understood that the SLM 180 may comprise any suitable assembly of components capable of providing the required amplitude and/or phase modulation in the pupil plane. The assembly of components may include one or more lenses, one or more apertures, and one or more arrays of individually controllable elements. An axial view of an example phase pattern produced by the SLM 180 is labelled 180' in FIG. 7. The SLM 180 is programmed, for example via a control unit 100, to redirect light in each of a plurality of pupil plane zones 181-184 in such a way as to form a corresponding plurality of images 91-94 at different locations on the sensor 23. Each image 91-94 is formed by radiation passing through a different respective one of the pupil plane zones 181-184. The SLM 180 may comprise any plurality of individually controllable optical elements capable of achieving the above functionality, including liquid crystal or digital micro-mirror based modalities. The individually controllable elements may be referred to as pixels. The number of pixels to include in the SLM 180 may be selected according to various factors, optionally including one or more of the following: the size of the target T to be measured, the focal length of the optical system, the NA of an objection lens of the optical system, and the wavelength of radiation being used to measure the target T. As an illustrative example, in one embodiment using a 25 micron beam spot and 500 nm radiation, it was found beneficial to use at least about 600×600 pixels, preferably about 1500× 1500.

In an embodiment, the SLM 180 imparts a phase gradient (i.e. a rate of change of phase imparted by the SLM 180 as a function of position within the plane of the SLM) in the pupil plane in each of two or more of the pupil plane zones 181-184. In an embodiment, the phase gradient is constant along all radial directions in the pupil plane in each of two or more of the pupil plane zones 181-184. In an embodiment, the phase gradient in each pupil plane zone 181-184 is such as to imitate an optical effect of one or more notional wedge-shaped optical elements (such as the group of wedge-shaped optical elements 81-84 described above with reference to FIG. 6) that each have a lower planar surface and an upper planar surface aligned obliquely with respect to the lower planar surface. In an embodiment, the notional wedge-shaped optical element corresponding to at least one of the pupil planes zones 181-184 has a different orientation, a different angle between the lower planar surface and the upper planer surface shape, or both, relative to a notional wedge-shaped optical element corresponding to at least one other of the pupil plane zones. Thus, the SLM 180 may imitate a group of wedge-shaped optical elements 81-84 as depicted in FIG. 6. In that particular example, each wedge-shaped optical element 81-84 had the same angle between the upper planar surface and the lower planar surface (i.e. the same wedge angle) and was oriented at 90 degrees relative to its neighbors and positioned so that a maximum gradient for each wedge-shaped element 81-84 was aligned radially.

In an embodiment, each of the plurality of pupil plane zones 181-184 consists of a zone within a different range of azimuthal angles relative to an optical axis of the optical system passing through the pupil plane. In an embodiment, the size of the range of azimuthal angles is the same for each pupil plane zone 181-184, such that the range for the k-th pupil plane zone of N pupil plane zones is from $$\frac{2\pi}{N}(k-1) \text{ to } \frac{2\pi}{N}k$$

relative to an arbitrary radial reference line. In the example of FIG. 7, four such pupil plane zones 181-184 are provided, such that the four zones define equal sized quadrants in the following angular ranges (in radians): 0 to π/2, π/2 to π, π to 3π/2, and 3π/2 to 2π. FIG. 8 depicts an alternative embodiment in which 12 different zones 181-192 of equal azimuthal angle size are provided. The flexibility provided by the SLM 180 means that the shape and size of the zones is not particularly limited, so that various other arrangements are possible, including arrangements which are not rotationally symmetric like the examples of FIGS. 7 and 8. An example of one such arrangement is shown in FIG. 9 for illustrative purposes. The enhanced flexibility provided by the SLM 180 facilitates a wide range of placements of different images without needing to replace any optical components or make other onerous compensating modifications to the measurement apparatus. The images can be arranged on the sensor 23, for example, in a way which achieves higher space filling efficiency than is easily possible using a fixed optical element such as a wedge-shaped optical element.

In an embodiment, the optical system is configured such that when the target T comprises a periodic structure 32-35, opposite signs (e.g. +1 and −1) of a higher than zeroth order diffraction component (e.g. first order diffracted rays) from the periodic structure 32-35 respectively pass through different ones (e.g. 182 or 184) of the pupil plane zones 181-184. In the embodiment of FIG. 7, this may be achieved for example by using the illumination mode 60 and target T as depicted in FIG. 6 to provide a pupil plane radiation distribution 74 as shown in FIG. 6. Taking the periodic structure 32 as an example, it can be seen that the +1 diffracted rays pass exclusively through the pupil plane zone 184 and the −1 diffracted rays pass exclusively though the diametrically opposite pupil plane zone 182. Directing the diffracted rays of different sign through different pupil plane zones allows images formed from the rays to be positioned at different respective locations on the sensor 23, thereby allowing the images to be measured separately. This allows asymmetry in the pupil plane to be measured efficiently (e.g. by comparing intensities of images from +1 diffracted rays with images from −1 diffracted rays).

In an embodiment, the optical system is configured such that when the target T comprises the periodic structure 32-35, zeroth order radiation predominantly passes through a pupil plane zone (e.g. 181 or 183) other than the pupil plane zones 182 and 184 through which the opposite signs (e.g. +1 and −1) of the higher than zeroth order diffraction components pass. Directing the zeroth order radiation through pupil plane zones other than those through which the higher than zeroth order radiation passes allows images formed exclusively from zeroth order radiation to be positioned at separate locations on the sensor 23, thereby allowing the images to be measured separately. This may allow information about the target T that is contained in the zeroth order radiation to be extracted more efficiently.

In an embodiment, the SLM 180 applies a modulation having a component of the following form:

$$W(k_x, k_y) = \begin{cases} \exp(j(s_{1x}k_x + s_{1y}k_y)) & \text{if } k_x > 0, k_y < 0 \\ \exp(j(s_{2x}k_x + s_{2y}k_y)) & \text{if } k_x < 0, k_y > 0 \\ \exp(j(s_{3x}k_x + s_{3y}k_y)) & \text{if } k_x < 0, k_y < 0 \\ \exp(j(s_{4x}k_x + s_{4y}k_y)) & \text{if } k_x > 0, k_y > 0 \end{cases}$$

where $k_x$ and $k_y$ are wave vectors representing orthogonal Fourier components of radiation in the pupil plane, and $s_{ix}$ and $s_{iy}$ define a phase gradient imparted by the spatial light modulator in each of four different pupil plane zones consisting of different quadrants in the pupil plane (and therefore determine the propagation direction of light passing through the respective pupil plane zones). The configuration of the SLM 180 discussed above and shown in FIG. 7 implements a modulation falling within this class of modulations. By changing the values of $s_{ix}$ and $s_{iy}$, which may be set for example by the control unit 100, it is possible flexibly to allow the SLM 180 to imitate wedge-shaped optical elements having a wide range of different angles and orientations.

In addition to imitating operation of wedge-shaped optical elements, the inventors have recognized that inclusion of an SLM 180 in the manner described above also provides the possibility to modify the images formed on the sensor 23 in ways that go beyond merely controlling the relative positions of images formed from different diffraction components of radiation reflected from the target T. In particular, in some embodiments, the SLM 180 is used to additionally apply an optical correction to radiation passing through the pupil plane. Various types of optical correction could in principle be applied, including for example one or more of the following: a focus adjustment, a correct for an optical aberration.

In an embodiment, the optical correction is applied by modulating the SLM 180 using a function of the following form $H(k_x,k_y)=\exp(j\Delta(k_x^2+k_y^2))$ where $\Delta$ represents an amount of the optical correction applied by the SLM 180, and $k_x$ and $k_y$ are wave vectors representing orthogonal Fourier components of radiation in the pupil plane. A modulation of this type would be effective for example for applying a focus adjustment. In an embodiment, the phase adjustment is used to correct for defocus error. Defocus error is problematic because it leads to a variation of intensity with position in images which should be of uniform intensity, as well as making it difficult to identify a region of interest (ROI) in each image. This makes it harder to compare the intensities of different images (e.g. to determine an asymmetry by comparing intensities in images formed from +1 and −1 diffracted rays from a periodic structure 32-25). Correcting for the defocus error reduces such variation of intensity and improves the accuracy of information derived from the images formed on the sensor 23 (e.g. overlay).

In an embodiment, an example of which is depicted in FIG. 10, the SLM 180 forms a plurality of groups 111-114 of images on the sensor 23. In the example of FIG. 10, four groups 111-114 of images are formed. Group 111 is positioned within an upper left quadrant in the square region of the sensor 23 shown in FIG. 10. Group 112 is positioned within a lower left quadrant in the square region of the sensor 23 shown in FIG. 10. Group 113 is positioned within a lower right quadrant in the square region of the sensor 23 shown in FIG. 10. Group 114 is positioned within an upper right quadrant in the square region of the sensor 23 shown in FIG. 10. Each image within each group contains four sub-images corresponding respectively to the four periodic structures 32-35 of the target T that is being measured in this example (which has the same form as the target T depicted in FIG. 6).

Each group 111-114 of images consists of images formed by redirecting light in each of the plurality of pupil plane zones to different locations on the sensor 23. In an embodiment, each group 111-114 contains images from radiation from the same set of different pupil plane zones. Thus, in an embodiment each group 111-114 could contain all of the four images shown in the axial view 23' of the sensor 23 in FIG. 7. In the particular example of FIG. 10, only two images are visible in each group (although each of the two images contains four sub-images respectively originating from the four different periodic structures 32-35 in the target T).

The SLM 180 applies a different optical correction (e.g. a different amount of correction, such as a different amount of focus adjustment) to each group 111-114 of images. The SLM 180 further forms each group 111-114 of images in a different region on the sensor 23. The effect of each different optical correction can therefore be assessed simultaneously. An optimal optical correction can be identified by comparing the different groups of images. In the example shown in FIG. 10, the optical correction (focus adjustment) applied to form group 113 appears to be the best (the images are sharpest). The images of group 113 can therefore be used to extract a parameter of interest (e.g. overlay) or further measurements could be performed using the optical correction corresponding to group 113, which the results of FIG. 10 have established as providing an improvement over other values for the optical correction and/or no optical correction. Alternatively or additionally, in an embodiment where the optical correction comprises a focus adjustment, the groups 111-114 formed with different focus adjustments may be used to obtain phase information. The phase information may be used for image reconstruction applications.

In an embodiment, the provision of groups of images having different optical corrections applied to them is implemented by configured the SLM 180 to apply a modulation having a component of the following form: $H(k_x,k_y)=\Sigma_i^N \exp(j\Delta(k_x^2+k_y^2))\exp(j(d_i^x k_x+d_i^y k_y))$ where $\Delta$ represents an amount of the optical correction applied by the spatial light modulator, $k_x$ and $k_y$ are wave vectors representing orthogonal Fourier components of radiation in the pupil plane, i is an index representing each of the N groups of images, and d represents different spatial shifts applied respectively to the different groups of images to cause each group of images to be formed in a different region on the sensor 23.

Where different components of a modulation applied by the SLM 180 are discussed above, it is understood that they may be combined with each other and/or with other modulations in any way, including for example by multiplying them together or by adding them together. For example, in an embodiment, the SLM 180 applies a modulation having a component of the following form: $W(k_x,k_y)H(k_x,k_y)$ where $k_x$ and $k_y$ are wave vectors representing orthogonal Fourier components of radiation in the pupil plane, $W(k_x,k_y)$ represents a first modulation that redirects light in each of a plurality of pupil plane zones to form a corresponding plurality of images at different locations on the sensor, each image being formed by radiation passing through a different respective one of the pupil plane zones, and $H(k_x,k_y)$ represents a second modulation that applies an optical correction to radiation passing through the pupil plane. $W(k_x,k_y)$ may take the detailed form described above or another form and/or $H(k_x,k_y)$ may take the detailed form described above or another form.

If a digital micro-mirror based SLM 180 is used, techniques such as Lee holography (see Wai-Hon Lee, "*Binary computer-generated holograms*", Applied Optics 18, 3661 (1979)) can be used to modulate both phase and amplitude. If the SLM 180 is only able to apply phase modulation, a Gerchberg-Saxton type algorithm (see R. W. Gerchberg and W. O. Saxton, "*A practical algorithm for the determination of the phase from image and diffraction plane pictures,*" Optik 35, 237 (1972); or Christian Maurer, et. al, "*Depth of field multiplexing in microscopy*", Optics Express, 18, 3023 (2010)) can be used to find an optimized phase pattern capable of providing the functionality required by the modulations described above.

The measurement apparatus described above may be used to measure a periodic structure formed by any lithographic process, including a lithographic process performed by a lithographic apparatus as described above with reference to FIGS. 1 and 2.

An embodiment of the disclosure may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may be made in this text to the use of a metrology apparatus in the manufacture of ICs, it should be understood that the metrology apparatus and processes described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or one or more various other tools. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example nanoimprint lithography, and where the context allows, is not limited to optical lithography. In the case of nanoimprint lithography, the patterning device is an imprint template or mold.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

References herein to crossing or passing a threshold may include something having a value lower than a specific value or lower than or equal to a specific value, something having a value higher than a specific value or higher than or equal to a specific value, something being ranked higher or lower than something else (through e.g., sorting) based on, e.g., a parameter, etc.

References herein to correcting or corrections of an error include eliminating the error or reducing the error to within a tolerance range.

The term "optimizing" and "optimization" as used herein refers to or means adjusting a lithographic apparatus, a patterning process, etc. such that results and/or processes of lithography or patterning processing have more a desirable characteristic, such as higher accuracy of projection of a design layout on a substrate, a larger process window, etc. Thus, the term "optimizing" and "optimization" as used herein refers to or means a process that identifies one or more values for one or more variables that provide an improvement, e.g. a local optimum, in at least one relevant metric, compared to an initial set of one or more values for those one or more variables. "Optimum" and other related terms should be construed accordingly. In an embodiment, optimization steps can be applied iteratively to provide further improvements in one or more metrics.

In an optimization process of a system, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Further embodiments according to the invention are described in below numbered clauses:

1. A measurement apparatus comprising:
    an optical system configured to illuminate a target with radiation and direct reflected radiation from the target to a sensor; and
    a programmable spatial light modulator in a pupil plane of the optical system, the spatial light modulator being programmed to redirect light in each of a plurality of pupil plane zones in such a way as to form a corresponding plurality of images at different locations on the sensor, each image being formed by radiation passing through a different respective one of the pupil plane zones.

2. The apparatus of clause 1, wherein the spatial light modulator is configured to impart a phase gradient in the pupil plane in each of two or more of the pupil plane zones.

3. The apparatus of clause 2, wherein the phase gradient is constant along all radial directions in the pupil plane in each of two or more of the pupil plane zones.

4. The apparatus of clause 2 or 3, wherein the phase gradient in each pupil plane zone is such as to imitate an optical effect of a notional wedge-shaped optical element having a lower planar surface and an upper planar surface aligned obliquely with respect to the lower planar surface.

5. The apparatus of clause 4, wherein the notional wedge-shaped optical element corresponding to at least one of the pupil planes zones has a different orientation, a different angle between the lower planar surface and the upper planer surface, or both, relative to a notional wedge-shaped optical element corresponding to at least one other of the pupil plane zones.

6. The apparatus of any preceding clause, wherein each of the plurality of pupil plane zones consists of a zone within a different range of azimuthal angles relative to an optical axis of the optical system passing through the pupil plane.

7. The apparatus of clause 6, wherein the size of the range of azimuthal angles is the same for each pupil plane zone, such that the range for the k-th pupil plane zone of N pupil plane zones is from $$\frac{2\pi}{N}(k-1) \text{ to } \frac{2\pi}{N}k$$

relative to an arbitrary radial reference line.

8. The apparatus of any preceding clause, wherein the optical system is configured such that when the target comprises a periodic structure, opposite signs of a higher than zeroth order diffraction component from the periodic structure respectively pass through different ones of the pupil plane zones.

9. The apparatus of clause 8, wherein the optical system is configured such that when the target comprises the periodic structure, zeroth order radiation predominantly passes through a pupil plane zone other than the pupil plane zones through which the opposite signs of the higher than zeroth order diffraction components pass.

10. The apparatus of any preceding clause, wherein the spatial light modulator is configured to apply a modulation having a component of the following form:

$$W(k_x, k_y) = \begin{cases} \exp(j(s_{1x}k_x + s_{1y}k_y)) & \text{if } k_x > 0, k_y < 0 \\ \exp(j(s_{2x}k_x + s_{2y}k_y)) & \text{if } k_x < 0, k_y > 0 \\ \exp(j(s_{3x}k_x + s_{3y}k_y)) & \text{if } k_x < 0, k_y < 0 \\ \exp(j(s_{4x}k_x + s_{4y}k_y)) & \text{if } k_x > 0, k_y > 0 \end{cases}$$

where $k_x$ and $k_y$ are wave vectors representing orthogonal Fourier components of radiation in the pupil plane, and $s_{ix}$ and $s_{iy}$ define a phase gradient imparted by the spatial light modulator in each of four different pupil plane zones consisting of different quadrants in the pupil plane.

11. The apparatus of any preceding clause, wherein:
    the spatial light modulator is configured to additionally apply an optical correction to radiation passing through the pupil plane.

12. The apparatus of clause 11, wherein the optical correction comprises one or more of the following: a focus adjustment; a correction for an optical aberration.

13. The apparatus of clause 11 or 12, wherein the spatial light modulator comprises a modulation component having the following form:

$$H(k_x, k_y) = \exp(j\Delta(k_x^2 + k_y^2))$$

where $\Delta$ represents an amount of the optical correction applied by the spatial light modulator, and $k_x$ and $k_y$ are wave vectors representing orthogonal Fourier components of radiation in the pupil plane.

14. The apparatus of any of clauses 11-13, wherein:
    the spatial light modulator is configured to form a plurality of groups of images on the sensor;
    each group of images consists of images formed by redirecting light in each of the plurality of pupil plane zones to different locations on the sensor;
    the spatial light modulator applies a different optical correction to each group of images; and
    the spatial light modulator forms each group of images in a different region on the sensor, thereby allowing the effect of each different optical correction to be assessed simultaneously.

15. The apparatus of clause 14, wherein the spatial light modulator is configured to apply a modulation having a component of the following form:

$$H(k_x, k_y) = \Sigma_i^N \exp(j\Delta(k_x^2 + k_y^2))\exp(j(d_i^x k_x + d_i^y k_y))$$

where $\Delta$ represents an amount of the optical correction applied by the spatial light modulator, $k_x$ and $k_y$ are wave vectors representing orthogonal Fourier components of radiation in the pupil plane, i is an index representing each of the N groups of images, and d represents different spatial shifts applied respectively to the different groups of images to cause each group of images to be formed in a different region on the sensor.

16. The apparatus of any preceding clause, wherein the spatial light modulator is configured to apply a modulation having a component of the following form:

$$W(k_x,k_y)H(k_x,k_y)$$

where $k_x$ and $k_y$ are wave vectors representing orthogonal Fourier components of radiation in the pupil plane;

$W(k_x,k_y)$ represents a first modulation that redirects light in each of a plurality of pupil plane zones to form a corresponding plurality of images at different locations on the sensor, each image being formed by radiation passing through a different respective one of the pupil plane zones; and $H(k_x,k_y)$ represents a second modulation that applies an optical correction to radiation passing through the pupil plane.

17. The apparatus of any preceding clause, wherein the sensor is configured to detect the images formed on different locations on the sensor in an imaging plane of the optical system.

18. The apparatus of clause 17, wherein the images formed at different locations on the sensor each comprise an image of a periodic structure of the target or a plurality of sub-images of different respective periodic structures of the target.

19. The apparatus of any preceding clause, wherein the target comprises at least one periodic structure formed by a lithographic apparatus.

20. A lithographic system comprising:
a lithographic apparatus configured to perform a lithographic process; and
the measurement apparatus of any preceding clause, wherein:
the lithographic apparatus is configured to use the result of a measurement by the measurement apparatus of a periodic structure formed by the lithographic process.

21. A method of measuring a target, comprising:
illuminating the target with radiation and detecting reflected radiation from the target on a sensor;
using a programmable spatial light modulator to redirect light in each of a plurality of pupil plane zones in a pupil plane to form a corresponding plurality of images at different locations on the sensor, each image being formed by radiation passing through a different respective one of the pupil plane zones.

22. The method of clause 21, further comprising using the programmable spatial light modulator to apply an optical correction to radiation passing through the pupil plane.

23. The method of clause 21 or 22, wherein:
the spatial light modulator is used to from a plurality of groups of images on the sensor;
each group of images consists of images formed by redirecting light in each of the plurality of pupil plane zones to different locations on the sensor;
a different optical correction is applied to each group of images; and
each group of images is formed in a different region on the sensor.

24. The method of clause 23, further comprising identifying an optimal optical correction by comparing the different groups of images.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The descriptions above are intended to be illustrative, not limiting. Thus, it will be apparent to one skilled in the art that modifications may be made to the disclosure as described without departing from the scope of the claims set out below.

The invention claimed is:

1. A measurement apparatus comprising:
an optical system configured to illuminate a target with radiation and direct reflected radiation from the target to a sensor; and
a programmable spatial light modulator in a pupil plane of the optical system,
wherein the spatial light modulator is configured to:
redirect light in each of a plurality of pupil plane zones in such a way as to form a corresponding plurality of images at different locations on the sensor, each image being formed by radiation passing through a different respective one of the pupil plane zones;
impart a phase gradient in the pupil plane in each of two or more of the pupil plane zones; and
apply an optical correction to radiation passing through the pupil plane, wherein the optical correction comprises a focus adjustment or a correction for an optical aberration.

2. The measurement apparatus of claim 1, wherein the phase gradient is constant along all radial directions in the pupil plane in each of two or more of the pupil plane zones.

3. The measurement apparatus of claim 1, wherein the phase gradient in each pupil plane zone is such as to imitate an optical effect of a notional wedge-shaped optical element having a lower planar surface and an upper planar surface aligned obliquely with respect to the lower planar surface.

4. The measurement apparatus of claim 3, wherein the notional wedge-shaped optical element corresponding to at least one of the pupil plane zones has a different orientation, a different angle between the lower planar surface and the upper planer surface, or both, relative to a notional wedge-shaped optical element corresponding to at least one other of the pupil plane zones.

5. The measurement apparatus of claim 1, wherein each of the plurality of pupil plane zones consists of a zone within a different range of azimuthal angles relative to an optical axis of the optical system passing through the pupil plane.

6. The measurement apparatus of claim 1, wherein:
the spatial light modulator is configured to form a plurality of groups of images on the sensor;
each group of images consists of images formed by redirecting light in each of the plurality of pupil plane zones to different locations on the sensor;
the spatial light modulator is configured to apply a different optical correction to each group of images; and
the spatial light modulator is configured to form each group of images in a different region on the sensor.

7. The measurement apparatus of claim 1, wherein:
to impart the phase gradient, the spatial light modulator is configured to apply a modulation comprising a component of the form:

$$W(k_x, k_y) = \begin{cases} \exp(j(s_{1x}k_x + s_{1y}k_y)) \text{ if } k_x > 0, \ k_y < 0 \\ \exp(j(s_{2x}k_x + s_{2y}k_y)) \text{ if } k_x < 0, \ k_y > 0 \\ \exp(j(s_{3x}k_x + s_{3y}k_y)) \text{ if } k_x < 0, \ k_y < 0 \\ \exp(j(s_{4x}k_x + s_{4y}k_y)) \text{ if } k_x > 0, \ k_y > 0 \end{cases};$$

$k_x$ and $k_y$ are wave vectors representing orthogonal Fourier components of radiation in the pupil plane; and
$s_{ix}$ and $s_{iy}$ define the phase gradient imparted by the spatial light modulator in each of four different pupil plane zones consisting of different quadrants in the pupil plane.

8. The measurement apparatus of claim 1, wherein:
to apply the optical correction, the spatial light modulator is configured to apply a modulation comprising a component of the form:

$$H(k_x,k_y)=\exp(j\Delta(k_x^2+k_y^2));$$

$\Delta$ represents an amount of the optical correction applied by the spatial light modulator; and
$k_x$ and $k_y$ are wave vectors representing orthogonal Fourier components of radiation in the pupil plane.

9. A method of measuring a target, comprising:
illuminating the target with radiation and detecting reflected radiation from the target on a sensor;
redirecting, using a programmable spatial light modulator, light in each of a plurality of pupil plane zones in a pupil plane to form a corresponding plurality of images at different locations on the sensor, each image being formed by radiation passing through a different respective one of the pupil plane zones;
imparting, using the programmable spatial light modulator, a phase gradient in the pupil plane in each of two or more of the pupil plane zones; and
applying, using the programmable spatial light modulator, an optical correction to radiation passing through the pupil plane, wherein the optical correction comprises a focus adjustment or a correction for an optical aberration.

10. The method of claim 9, further comprising:
forming, using the programmable spatial light modulator, a plurality of groups of images on the sensor;
wherein:
each group of images consists of images formed by redirecting light, using the programmable spatial light modulator, in each of the plurality of pupil plane zones to different locations on the sensor;
a different optical correction is applied, using the programmable spatial light modulator, to each group of images; and
each group of images is formed, using the programmable spatial light modulator, in a different region on the sensor.

11. The method of claim 10, further comprising identifying an optimal optical correction by comparing the different groups of images.

12. The method of claim 9, wherein:
imparting the phase gradient comprises applying, using the programmable spatial light modulator, a modulation comprising a component of the form:

$$W(k_x, k_y) = \begin{cases} \exp(j(s_{1x}k_x + s_{1y}k_y)) \text{ if } k_x > 0, \ k_y < 0 \\ \exp(j(s_{2x}k_x + s_{2y}k_y)) \text{ if } k_x < 0, \ k_y > 0 \\ \exp(j(s_{3x}k_x + s_{3y}k_y)) \text{ if } k_x < 0, \ k_y < 0 \\ \exp(j(s_{4x}k_x + s_{4y}k_y)) \text{ if } k_x > 0, \ k_y > 0 \end{cases};$$

$k_x$ and $k_y$ are wave vectors representing orthogonal Fourier components of radiation in the pupil plane; and $s_{ix}$ and $s_{iy}$ define the phase gradient imparted by the spatial light modulator in each of four different pupil plane zones consisting of different quadrants in the pupil plane.

13. The method of claim 9, wherein:

applying the optical correction comprises applying, using the programmable spatial light modulator, a modulation comprising a component of the form:

$$H(k_x, k_y) = \exp(j\Delta(k_x^2 + k_y^2));$$

$\Delta$ represents an amount of the optical correction applied by the spatial light modulator; and $k_x$ and $k_y$ are wave vectors representing orthogonal Fourier components of radiation in the pupil plane.

* * * * *